(12) United States Patent
Hennighausen et al.

(10) Patent No.: US 11,997,934 B2
(45) Date of Patent: May 28, 2024

(54) LASER-WRITTEN SUBMICRON PIXELS WITH TUNABLE CIRCULAR POLARIZATION AND WRITE-READ-ERASE-REUSE CAPABILITY ON A NANO MATERIAL OR TWO-DIMENSIONAL HETEROSTRUCTURE AT ROOM TEMPERATURE

(71) Applicant: The Government of the United States of America, as represented by the Secretary of the Navy, Arlington, VA (US)

(72) Inventors: Zachariah B. Hennighausen, Mount Rainier, MD (US); Kathleen M. McCreary, Washington, DC (US); Olaf M. J. van 't Erve, Falls Church, VA (US); Berend T. Jonker, Davidsnville, MD (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 289 days.

(21) Appl. No.: 17/690,263

(22) Filed: Mar. 9, 2022

(65) Prior Publication Data
US 2022/0367798 A1    Nov. 17, 2022

Related U.S. Application Data

(60) Provisional application No. 63/317,925, filed on Mar. 8, 2022, provisional application No. 63/187,565, filed on May 12, 2021.

(51) Int. Cl.
*H10N 70/20*  (2023.01)
*B82Y 10/00*  (2011.01)
(Continued)

(52) U.S. Cl.
CPC ............ *H10N 70/257* (2023.02); *B82Y 10/00* (2013.01); *B82Y 20/00* (2013.01); *B82Y 40/00* (2013.01);
(Continued)

(58) Field of Classification Search
CPC ............... H10N 70/257; H10N 70/023; H10N 70/8613; H10N 70/8825; H10N 70/883;
(Continued)

(56) References Cited

FOREIGN PATENT DOCUMENTS

WO PCT/US2019/067298    6/2020
WO WO202020132152    6/2020

OTHER PUBLICATIONS

Mudachathi et al., "Up Scalable Full Colour Plasmonic Pixels with Controllable Hue, Brightness and Saturation", Scientific Reports, 7, 1199 (Year: 2017).*
(Continued)

*Primary Examiner* — Ajay Ojha
(74) *Attorney, Agent, or Firm* — US Naval Research Laboratory; Stephen T. Hunnius

(57) ABSTRACT

A method of laser-writing submicron pixels with tunable circular polarization and write-read-erase-reuse capability on $Bi_2Se_3/WS_2$ at room temperature, comprising the steps of applying a laser to the $Bi_2Se_3/WS_2$, writing a submicron pixel, wherein the submicron pixel has a circular polarization, modifying the circular polarization, allowing the circular polarization to be tuned across a range of 39.9%, tuning photoluminescence intensity, and tuning photoluminescence peak position. A method of growing $Bi_2Se_3/WS_2$ as a nano-material or two-dimensional heterostructure for laser-writing submicron pixels with tunable circular polarization and write-read-erase-reuse capability on the $Bi_2Se_3/WS_2$ heterostructure at room temperature.

19 Claims, 14 Drawing Sheets

(51) Int. Cl.
*B82Y 20/00* (2011.01)
*B82Y 40/00* (2011.01)
*G11C 7/00* (2006.01)
*H10N 70/00* (2023.01)

(52) U.S. Cl.
CPC .......... *G11C 7/005* (2013.01); *H10N 70/023* (2023.02); *H10N 70/8613* (2023.02); *H10N 70/8825* (2023.02); *H10N 70/883* (2023.02)

(58) Field of Classification Search
CPC ......... B82Y 10/00; B82Y 20/00; B82Y 40/00; B82Y 30/00; G11C 7/005; G11B 2007/24324; G11B 7/243; G11B 7/2433
See application file for complete search history.

(56) References Cited

OTHER PUBLICATIONS

Balaur et al., "Continuously Tunable, Polarization Controlled, Colour Palette Produced from Nanoscale Plasmonic Pixels", Scientific Reports | 6:28062 | DOI: 10.1038/srep28062 (Year: 2016).*

Hennighausen, Zachariah, et al. "Widely tunable Bi2Se3/transition metal dichalcogenide 2D heterostructures for write-read erase-reuse applications." 2D Materials 6.4 (2019): 041003.

Hennighausen, Zachariah, et al. "Evidence of a purely electronic two-dimensional lattice at the interface of TMD/Bi 2 Se 3 heterostructures." Nanoscale 11.34 (2019): 15929-15938.

Hennighausen, Zachariah, et al. "Oxygen-induced in situ manipulation of the interlayer coupling and exciton recombination in Bi2Se3/MoS2 2D heterostructures." ACS applied materials & interfaces 11.17 (2019): 15913-15921.

Hennighausen, Zachariah, et al. "Evidence of Purely Electronic Lattice at Interface of TMD/Bi 2 Se 3 2D Heterostructures Induced by Strong Interlayer Coupling." Bulletin of the American Physical Society 65 (2020).

* cited by examiner

LASER-WRITTEN SUBMICRON PIXELS WITH TUNABLE CIRCULAR POLARIZATION AND WRITE-READ-ERASE-REUSE CAPABILITY ON A NANO MATERIAL OR TWO-DIMENSIONAL HETEROSTRUCTURE AT ROOM TEMPERATURE

REFERENCE TO RELATED APPLICATION

This application is a non-provisional of, and claims priority to and the benefits of, U.S. Provisional Patent Application No. 63/187,565 filed on May 12, 2021, and U.S. Provisional Patent Application No. 63/317,925 filed on Mar. 8, 2022, the entireties of each are herein incorporated by reference.

BACKGROUND

This disclosure concerns circular polarization of a two-dimensional (2D) heterostructure which can be tuned across a wide (~39.9%) range using a low-power laser at room temperature.

Additionally, this disclosure concerns superdense multidimensional optical data storage and encryption, oxygen sensing, and oxygen storage for lab-on-a-chip.

Circular Polarization Communication transmits bits through different states of circular polarization, via amplitude, frequency, and/or phase modulation. Communicating along a different vector provides increased bandwidth and resiliency. Additionally, circular polarization offers line-of-sight communication, diminishing adversarial eaves dropping. This mitigates tactical-level risk to communications degradation, a primary objective for the Augmented Warfighter.

Multi-domain and Multispectral Sensors are employed by electronic maneuver warfare (EMW) to continuously monitor the spectrum, enabling persistence awareness and providing a better understanding of the shape of the battlespace. Advanced solid state circular polarization sensors are critical to monitor the entire spectrum.

Quantum Computing is an emerging technology; however, significant hurdles remain. Circular polarization is a promising medium to transmit qubits. Additionally, monolayer $WS_2$ is a promising material for storing qubits and facilitating quantum communications technology.

Superdense Multistate Multidimensional Optical Data Storage and Image Encryption may be able to harness the emerging power of big data and transform vast data into timely knowledge. Optical communications and data storage are a promising avenue to overcome bandwidth and power density limitations through electrical connections. Additionally, they have shown promise to address challenges with current data storage technology, including energy efficiency, information density, and limited lifetime. Innovative big data storage is needed to facilitate analytics and machine learning, which leads to enhanced insight, rapid decision making and new mission capabilities. We demonstrate write-read-erase-reuse submicron (814 nm) pixels with tunable circular polarization, emission energy (wavelength), and intensity for optical data storage and encryption.

Circular polarization has enabled a variety of technologies across disparate fields.

Quantum Communications uses the orthogonal nature of left vs. right polarization to store and manipulate qubits. Additionally, the photon's angular momentum can be transferred to an electron in a material, providing quantum interface for converting information media between photon polarization and spin orientation.

Valleytronics and Spintronics Applications store and manipulate bits using the minima of electronic band structure (valleytronics), and using the spin of electrons (spintronics), which have demonstrated promise for energy efficient computing, advanced memory and processing capabilities, and quantum computing.

Multidimensional and Multistate Optical Data Storage, and Image Encryption: Write-read-erase-reuse pixels with tunable circular polarization, emission energy (wavelength), and intensity. The pixels can be written with submicron features (814 nm), and the data can be read using fluorescence imaging, enabling superdense optical data storage and rapid read capability. Optical communications and data storage are a promising avenue to overcome bandwidth and power density limitations through electrical connections.

Nonlinear Image Encryption relies on circular polarization detectors and emitters, and is a promising next-generation technology for securing communications.

Biological and chemical identification and sensing rely on changes in circular polarization between materials.

Global Navigation Satellite Systems and Communication Systems rely on circular polarization to reduce the noise floor and improve signal acquisition. The U.S. Global Positioning System (GPS), for example, uses circular polarization. Our circular polarization technology has applications for positioning and communication systems. In particular, circular polarization is well suited for line-of-sight communications, which discourages eaves dropping.

Astronomy and astrophysics researchers rely on changes in circular polarization to make fundamental and applied measurements of the universe.

Photons have electric and magnetic fields spaced 90° apart that oscillate perpendicular to the direction of motion. The polarization of a photon is defined by the direction of the electric field. A common light bulb emits non-polarized light, where it contains a population of photons that oscillate along a distribution of orientations from 0 to 360°. Conversely, linear polarized light only contains photons that oscillate along a specific direction e.g., the electric field oscillates along the x-axis. Hence, light can be described by two orthogonal vectors (e.g., x and y directions), where one component can be filtered out without affecting the signal of the second component.

Photons can be converted from linear polarization into circular polarization, where the fields oscillate either clockwise or counter clockwise. This is noteworthy because the left and right directions are orthogonal vectors. Additionally, the photon now carries angular momentum, which can be used to manipulate electron spin in materials.

A vast majority of the circular polarizers rely on fabricating a lens or metamaterial with a fixed circular polarization. Once the material is fabricated, it cannot be adjusted. Further, the metamaterials often require complex lithography to fabricate.

This is in contrast to our technology where the circular polarization can be easily tuned with a low-power laser at submicron resolution.

Two-dimensional (2D) transition metal dichalcogenides (TMDs) have shown particular promise for next-generation circular polarization technology. When the 2D material is doped, one publication reported circular polarization values as high as 60% at room temperature, and 90% when cooled to 80° K. A recent work demonstrated in situ doping of $MoS_2$ using a laser, which allowed the circular polarization to be adjusted ~12%; however, the circular polarization was only observed at extraordinarily low temperatures (4° K). The work found demonstrates significantly less circular polarization when at room temperature, due to phonon scattering and decoherence mechanisms.

Recently published work demonstrated gate-tunable circular polarization; however, the effect is significantly less pronounced at room temperature (<8° shift in circular polarization) and disappears when the gating-induced electric field is removed. At lower temperatures (80° K) the circular polarization could be tuned as much as 18% using gating; however, such a setup would require costly cooling, making the technology less desirable. A setup relying on gating the material requires complex device fabrication, an external power source, and is not permanent. In contrast, our 2D technology requires only a common low-power laser, and is stable without external power.

To the best of our knowledge, no technology has been demonstrated that can tune the local circular polarization using a laser at room temperature, making this finding novel. Additionally, the technology is robust with changes remaining for over 106 days, and offers write-read-erase-reuse capability.

Valleytronics is an emerging technology that exploits the local minima of electronic band structure (i.e., the valleys) with the aim of writing, storing, reading, and manipulating bits of information. Similarly, spintronics aims to manipulate bits using the spin of electrons. Both valleytronics and spintronics have demonstrated particular promise for quantum computing and neuromorphic computing, emerging technologies that are of high interest to industry and the U.S. Navy.

Monolayer transition metal dichalcogenides (TMDs), including monolayer $WS_2$, are considered very attractive for valleytronics and spintronics applications. For example, monolayer $WS_2$ has two distinct valleys located at K and K', respectively, that have opposite spin orientations, enabling the valley degrees of freedom and spin to be coupled. These spin-orthogonal valleys give rise to a circular polarization. Monolayer $WS_2$ also has long-lived, tightly bound excitons, bestowing further benefits for optical applications. Lastly, they have demonstrated competitive device and electronic performance.

Since the underlying monolayer $WS_2$ has two distinct valleys (i.e., K and K'), and we demonstrate spatially selective tunable circular polarization, the technology we demonstrate has applications to valleytronics, spintronics, and quantum communications.

We demonstrate write-read-erase-reuse pixels with tunable circular polarization, operating wavelength, and intensity, enabling high density multidimensional and multistate optical data storage and optical image encryption.

Data storage power efficiency, cost, and security are top priorities for industry and the U.S. Navy, and have played an increasingly important role as digitization and connectivity increase. Innovative big data storage is needed to facilitate analytics and machine learning, which leads to enhanced insight, rapid decision making, and new mission capabilities. Optical communications and data storage are a promising avenue to overcome bandwidth and power density limitations through electrical connections. Additionally, they have shown promise to address challenges with current data storage technology, including energy efficiency, information density, and limited lifetime.

Optical data storage is an industry and competitive field of research. A variety of published research has demonstrated high-density optical storage, as well as promising write-read-erase-reuse capability.

In contrast, our technology differentiates itself with its tunable circular polarization. To the best of our knowledge, no technology has been demonstrated that modifies the local circular polarization using a laser at room temperature, making this finding very novel.

Optical image encryption is a promising avenue to improve communication security and encryption. Current methods for optical image encryption rely on lithography to pattern complex structures and metamaterials. We demonstrate that complex patterns can be written with a low-power, common laboratory laser at room temperature. Additionally, the patterns can be erased and reused at room temperature.

Oxygen sensors and storage are ubiquitous and low-cost. However, our technology has an advantage in that it is nanoscale, being only a few nanometers tall, enabling major size reduction for nonintrusive incorporated sensors, possibly for passive data collection.

Previous work demonstrated that $Bi_2Se_3/MoS_2$ 2D heterostructures could act as oxygen sensors and could store oxygen; however, we found no work has been done using $Bi_2Se_3/WS_2$. Additionally, the results in our work are of higher resolution, and show greater reusability.

We demonstrate that our results are in close agreement with Fick's Law of Diffusion, suggesting this material is storing and releasing oxygen in response to laser exposure in air and vacuum, respectively. Storing and releasing oxygen in a nanomaterial has lab-on-a-chip applications.

SUMMARY OF DISCLOSURE

Description

This disclosure concerns circular polarization of a two-dimensional (2D) heterostructure, $Bi_2Se_3/WS_2$, which can be tuned across a wide (~39.9%) range using a low-power laser at room temperature.

Additionally, this disclosure concerns superdense multidimensional optical data storage and encryption, oxygen sensing, and oxygen storage for lab-on-a-chip.

The current invention solves long-standing problems with its tunable circular polarization. To the best of our knowledge, no technology has been demonstrated that modifies the local circular polarization using a laser at room temperature, making this finding very novel. Additionally, the technology is robust with changes remaining for over 334 days, and offers write-read-erase-reuse capability.

Optical image encryption is a promising avenue to improve communication security and encryption. Current methods for optical image encryption rely on lithography to pattern complex structures and metamaterials.

We demonstrate that complex patterns can be written with a low-power, common laboratory laser at room temperature. Additionally, the patterns can be erased and reused at room temperature.

Oxygen sensors and storage are ubiquitous and low-cost. However, our technology has an advantage in that it is nanoscale, being only a few nanometers tall, enabling major size reduction for nonintrusive incorporated sensors, possibly for passive data collection.

Circular polarization is tunable using a low-power laser at room temperature, suggesting simple and low-cost integration without the need for external temperature control.

Material is nanoscale (~2-5 nm tall), suggesting it integrates well with next-generation nano-technology.

Material is grown using a two-step chemical vapor deposition (CVD) process, suggesting fabrication is scalable and low-cost.

We demonstrate write-read-erase-reuse capability.

We demonstrate laser writing with submicron (814 nm) feature resolution.

Laser-written patterns are stable for more than several months at room temperature.

We also demonstrate the following secondary applications and technology:

Highly-tunable photoluminescence intensity across a large (×160 factor) range.

Highly-tunable photoluminescence peak position across a large (~38 meV) range. Oxygen sensor applications are demonstrated.

Oxygen storage and release in a 2D material are demonstrated, suggesting lab-on-a-chip applications.

Historically, tunable circular polarization is not demonstrated using a low-power laser at room temperature, with changes being robust and not dependent on an external power source.

We have demonstrated low-power laser tuning of the photoluminescence (PL) intensity and peak position of $Bi_2Se_3/WS_2$ with high-resolution and precision for applications in multistate and multidimensional optical memory.

We have demonstrated oxygen sensing or storage applications using the $Bi_2Se_3/WS_2$ 2D heterostructures.

The material system $Bi_2Se_3/WS_2$ is a new material, therefore we believe our work is the first to demonstrate this activity.

Our previous work on $Bi_2Se_3/MoS_2$ 2D heterostructures demonstrated tunable photoluminescence intensity using a laser in an oxygen-present environment. However, this work solely focuses on $MoS_2$, and $WS_2$ is not mentioned, and a tunable peak position is not demonstrated. Circular polarization is not mentioned.

DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings.

DETAILED DESCRIPTION OF THE INVENTION

Figure 1:
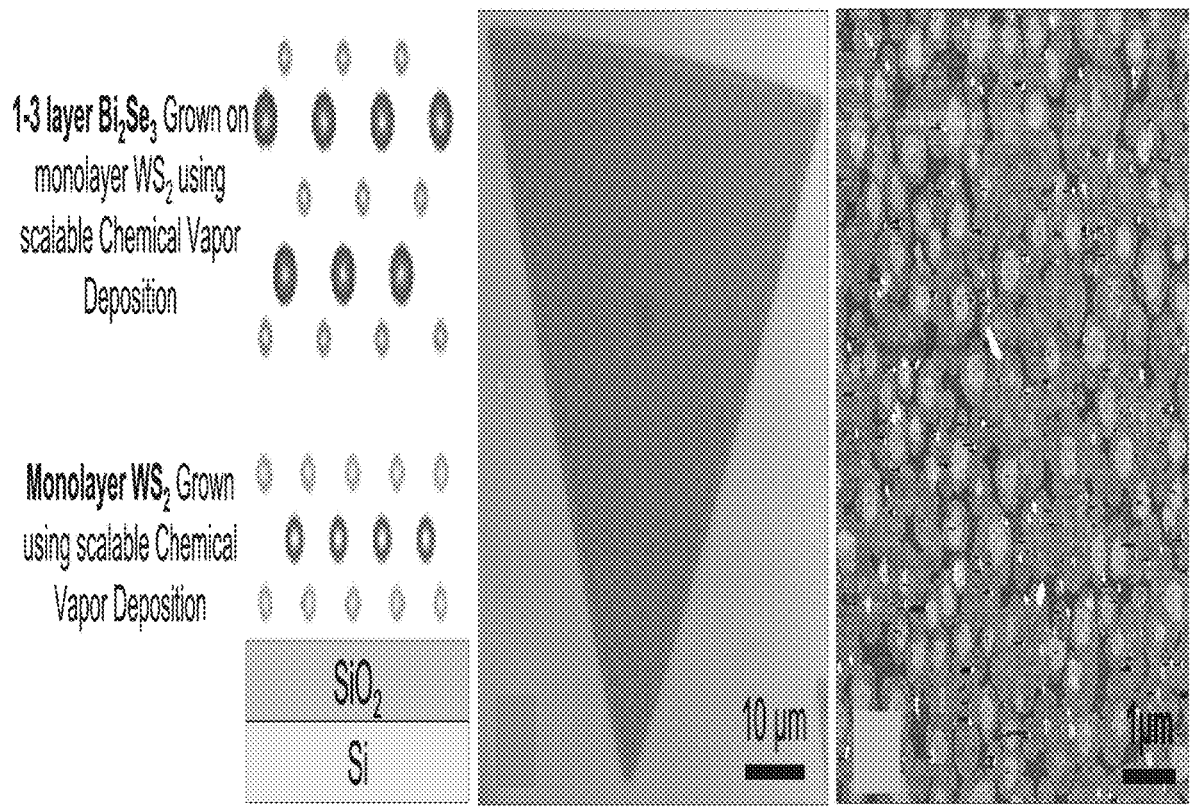
FIG. 1 illustrates an As-Grown $Bi_2Se_3/WS_2$ 2D Heterostructure. A Schematic of the $Bi_2Se_3/WS_2$ 2D Heterostructure. Monolayer $WS_2$ is grown using chemical vapor deposition (CVD) on a $SiO_2/Si$ substrate. 1-3 Layers of $Bi_2Se_3$ are then grown on top of the monolayer $WS_2$ using CVD. Representative optical image, and atomic force microscopy (AFM) scan of the 2D heterostructure. The AFM scan shows near complete coverage $Bi_2Se_3$. A majority is bilayer $Bi_2Se_3$ coverage with islands of trilayer, and gaps of monolayer.

This disclosure teaches methods and devices for write-read-erase-reuse pixels with tunable circular polarization, emission energy (wavelength), and intensity. The pixels can be written with submicron features (814 nm), and the data can be read using fluorescence imaging, enabling super-dense optical data storage and rapid read capability.

Optical communications and data storage are a promising avenue to overcome bandwidth and power density limitations through electrical connections.

Circular polarization is tunable using a low-power laser at room temperature, suggesting simple and low-cost integration without the need for external temperature control.

Material is nanoscale (~2-5 nm tall), suggesting it integrates well with next-generation nano-technology.

Material is grown using a two-step chemical vapor deposition (CVD) process, suggesting fabrication is scalable and low-cost.

We demonstrated write-read-erase-reuse capability.

We demonstrated laser writing with submicron (814 nm) feature resolution.

Laser-written patterns are stable for more than several months at room temperature.

We demonstrated that the DoCP is reversible, along with the PL intensity and peak position, and that it can be reliably tuned within a range. DoCP was measured as the atmosphere was switched between air vs. vacuum.

We also demonstrated the following secondary applications and technology:

Highly-tunable photoluminescence intensity across a large (×160 factor) range.

Highly-tunable photoluminescence peak position across a large (~38 meV) range.

Oxygen sensor applications are demonstrated.

Oxygen storage and release in a 2D material are mostly demonstrated, suggesting lab-on-a-chip applications.

Example 1

Monolayer transition metal dichalcogenides (TMDs) are synthesized at ambient pressure in 2-inch diameter quartz tube furnaces on $SiO_2/Si$ substrates (275 nm thickness of $SiO_2$). The procedure to grow monolayer $WS_2$ follow similar steps, as outlined below, but are performed in separate furnaces to prevent cross-contamination.

Example 2

Prior to use, all $SiO_2/Si$ substrates are cleaned in acetone, IPA, and Piranha etch ($H_2SO_4+H_2O_2$) then thoroughly rinsed in DI water. At the center of the furnace is positioned a quartz boat containing ~1 g of $WO_3$ powder. Two $SiO_2/Si$ wafers are positioned face-down, directly above the oxide precursor. A separate quartz boat containing sulfur powder is placed upstream, outside the furnace-heating zone, for the synthesis of $WS_2$. The upstream $SiO_2/Si$ wafer contains perylene-3,4,9,10-tetracarboxylic acid tetrapotassium salt (PTAS) seeding molecules, while the downstream substrate is untreated. The hexagonal PTAS molecules are carried downstream to the untreated substrate and promote lateral growth of the monolayer $WS_2$. Pure argon (65 sccm) is used as the furnace heats to the target temperature. Upon reaching the target temperature of 825° C., 10 sccm $H_2$ is added to the Ar flow and maintained throughout the 10 minute soak and subsequent cooling to room temperature.

Example 3

$Bi_2Se_3$ was grown on top of the TMDs using chemical vapor deposition (CVD) in a two-zone furnace with a 2" quartz tube. High-purity $Bi_2Se_3$ flakes are ground using a mortar and pestle into a fine dust. The powdered $Bi_2Se_3$ is placed in a ceramic boat and inserted into the furnace's quartz tube, and pushed into the center of the furnace's first zone. The monolayer TMD, which is on an $SiO_2$ substrate, is placed downstream of the $Bi_2Se_3$ into the center of the furnace's second zone. The furnace is pumped down to ~20 mTorr. An argon (Ar) carrier gas is flown into the furnace at 80 sccm. The $Bi_2Se_3$ is heated to 520° C., and the $WS_2$ are heated to 210° C. The ramp rate is ~55° C./min, and the total growth is 27 min.

Example 4

FIG. 1 shows a schematic of the $Bi_2Se_3/WS_2$ 2D heterostructure as well as characterization of the system. Monolayer $WS_2$ is grown on a $SiO_2/Si$ wafer using chemical vapor deposition (CVD), and then 1-3 layers of $Bi_2Se_3$ is grown on the monolayer $WS_2$ using CVD. CVD is a highly scalable and a comparatively low-cost growth method, making the material attractive for commercialization. FIG. 1 is a illustration of the material. FIG. 1 is an optical image of the material, where the triangular design suggests the $WS_2$ grows crystalline. FIG. 1 is an atomic force microscope (AFM) scan of a representative $Bi_2Se_3/WS_2$ 2D heterostructure showing near complete coverage of $Bi_2Se_3$ on $WS_2$. A majority of the sample has bilayer $Bi_2Se_3$ with islands of trilayer $Bi_2Se_3$ and gaps of monolayer $Bi_2Se_3$.

Example 5

Figure 2:
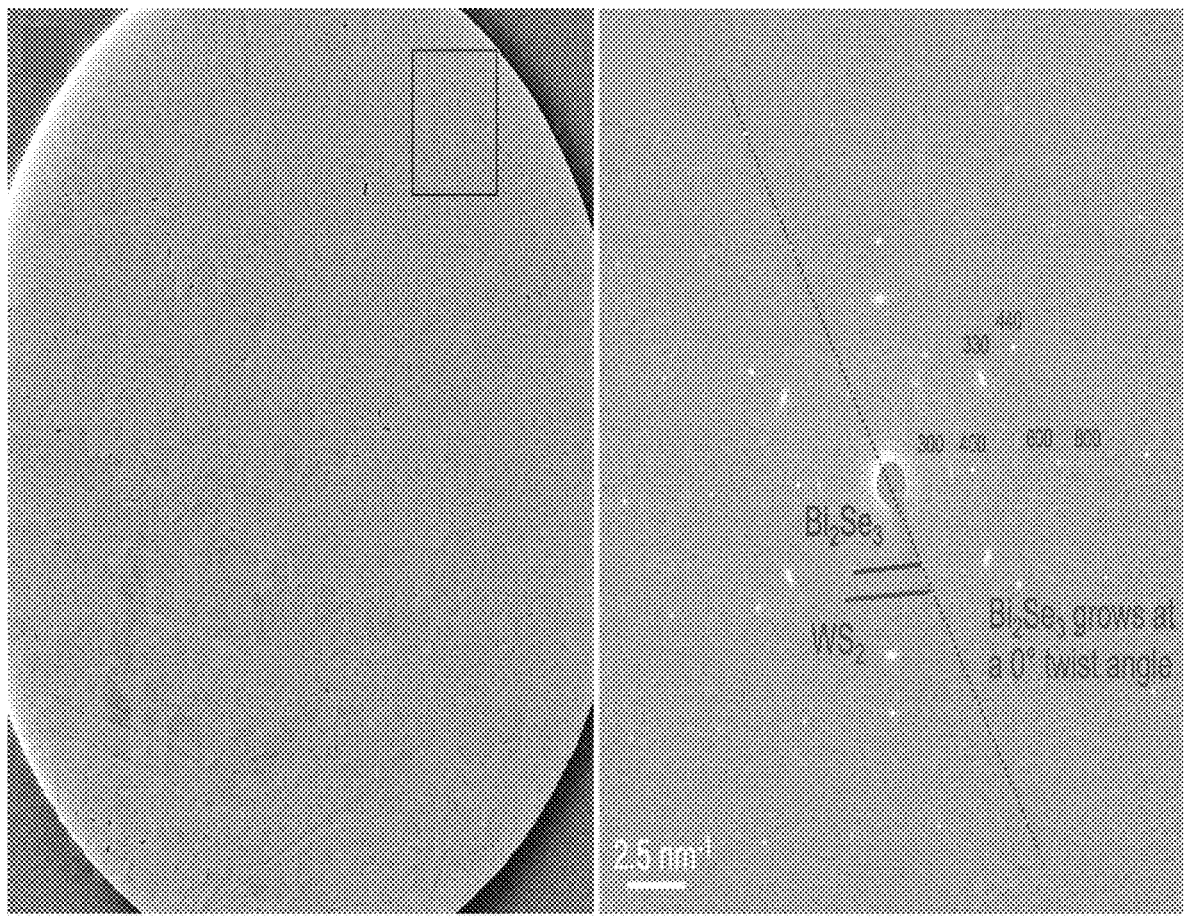
FIG. 2 is a Transmission Electron Microscope (TEM) imaging and diffraction of a $Bi_2Se_3/WS_2$ 2D Heterostructure. Imaging and diffraction measurements showing $Bi_2Se_3$ grows crystalline and at a 0° twist angle (i.e., aligned with the $WS_2$).

FIG. 2 shows s transmission electron microscope (TEM) image and diffraction measurement of a $Bi_2Se_3$-$WS_2$ 2D heterostructure. Monolayer $Bi_2Se_3$ flakes several microns in size were grown on monolayer $WS_2$. The well-formed spots in the diffraction image suggest both $Bi_2Se_3$ and $WS_2$ have long-range crystallinity. Additionally, the $Bi_2Se_3$ crystals appear to grow at a 0° twist angle, suggesting this is the most stable configuration, and the interlayer interaction modulates the growth.

Example 6

Another embodiment of the invention is laser-written (814 nm) submicron pixels with tunable circular polarization and write-read-erase-reuse capability on a two-dimensional (2D) nano material (i.e., monolayer $WS_2$ with 1-3 layers $Bi_2Se_3$ grown on top) at room temperature. Secondary modes include: tunable photoluminescence (PL) intensity and peak position (e.g., emission color/wavelength) for superdense multidimensional optical data storage, as well as oxygen sensing and storage applications.

Example 7

Figure 3:
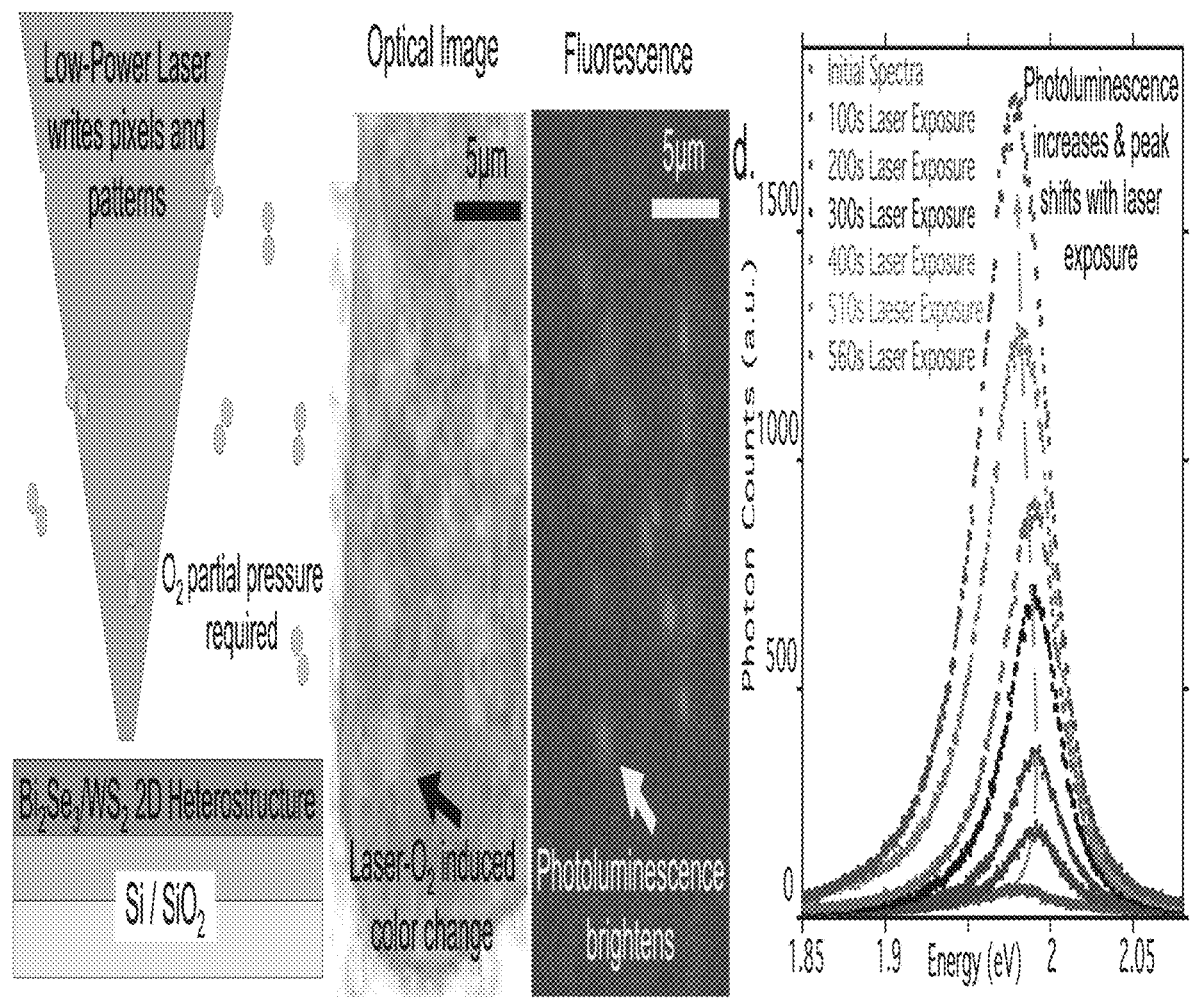
FIG. 3 illustrates Low-Power Laser Writes Pixels and Patterns. Schematic of setup. Oxygen is required to induce changes in an as-grown sample. Optical image and fluorescence image of a $Bi_2Se_3/WS_2$ 2D heterostructure patterned with the letter "N" using a laser. The exposure time determines the luminescence intensity. Submicron (814 nm) pixel resolution is demonstrated. PL spectra of as-grown 2D heterostructure, and numerous spectra at different laser-exposure times. The PL spectra increases ×39.8, and the peak shifts 13.6 meV. Guide to the eye highlights the nonlinear evolution of the PL peak position, initially shifting higher in energy, before reversing and shifting lower in energy. The contrast, brightness, and sharpness of the optical image were adjusted to better reveal the color changes.
Figure 4:
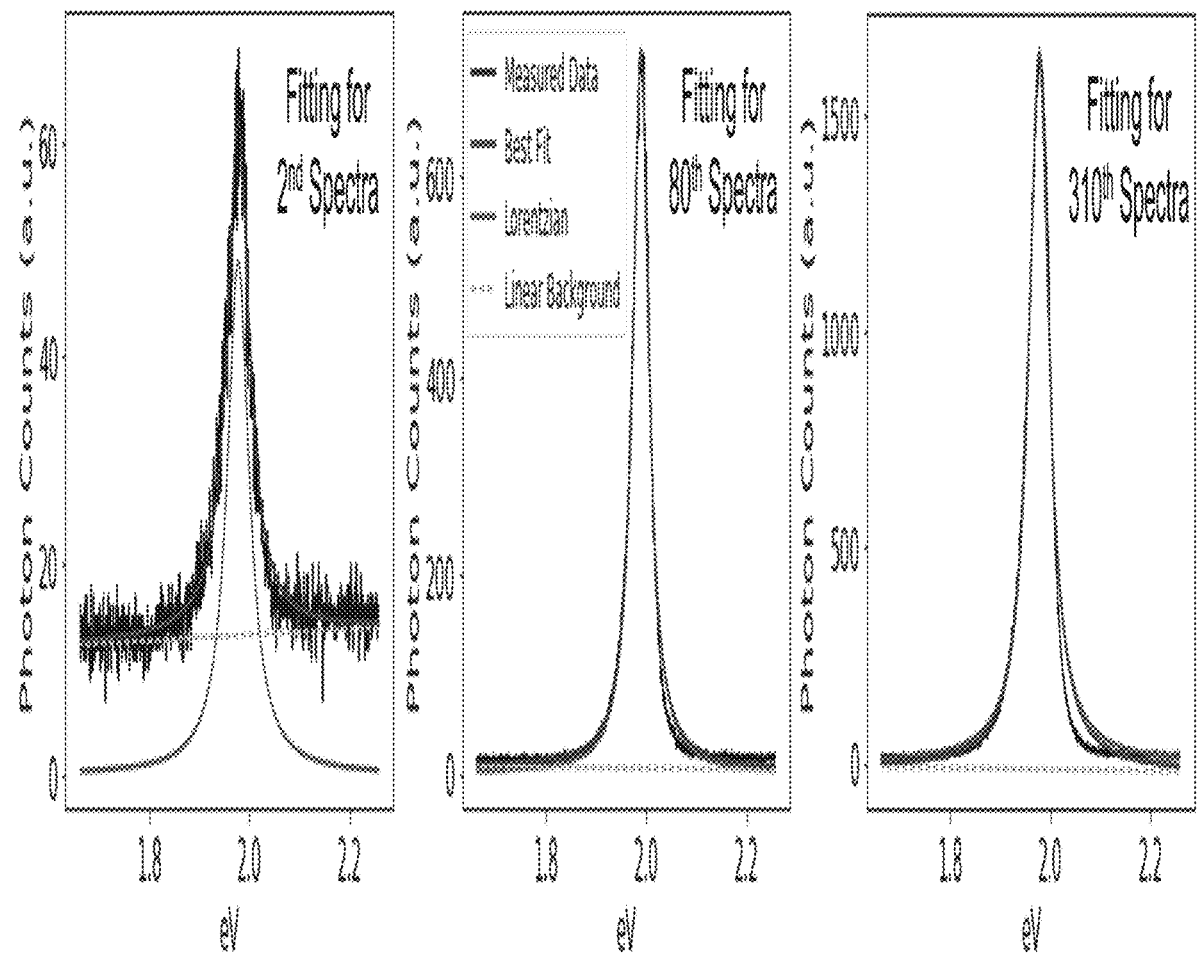
FIG. 4 illustrates Representative Lorentzian (and Background) Fitting for Intensity and Peak Position Extraction. The PL intensity and peak position are quantitively extracted with low error by fitting them with a Lorentzian function and a linear background. The resulting function consistently produces a good fit across different data sets and samples. Robust fitting ensures that the global minima is found with low error.
Figure 5:
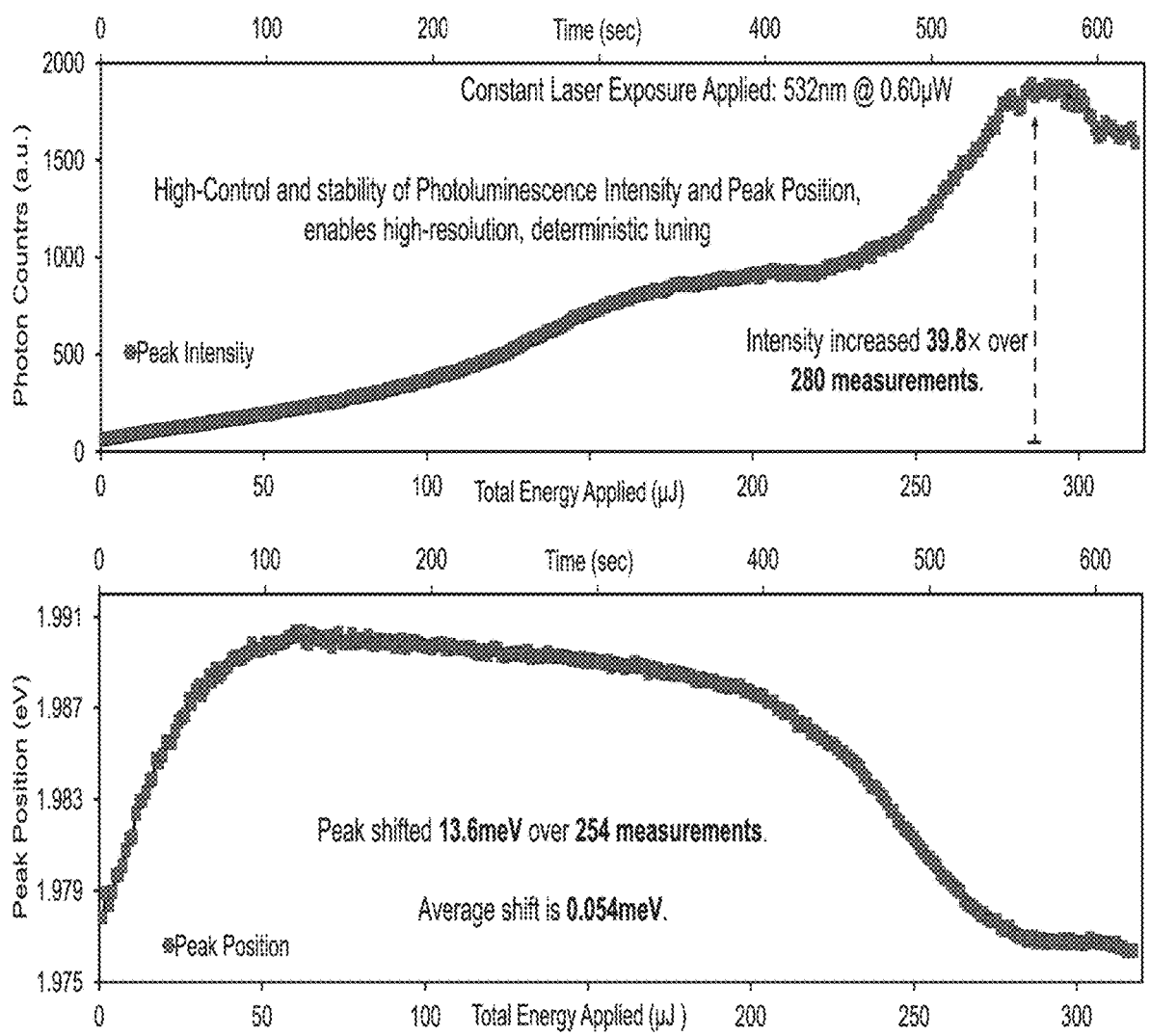
FIG. 5 illustrates Photoluminescence intensity and peak position can be tuned with high resolution. PL intensity, and peak position shift in response to continuous exposure of a low-power (0.60 µW) 532 nm laser. Each data point is extracted using robust fitting of the PL spectrum (see FIG. 3). The intensity increases a factor of ×39.8 over 280 measurements, before plateauing and slightly decreasing. The PL peak position shifts upward, and then decreases 13.6 meV over 254 measurements. The PL intensity and peak position evolution are smooth, containing low error and low noise. Lastly, the large number of spectra taken demonstrate the possibility for high-resolution and precise tuning. Error bars are present, but cannot be seen because they are smaller than the marker size.
Figure 6:
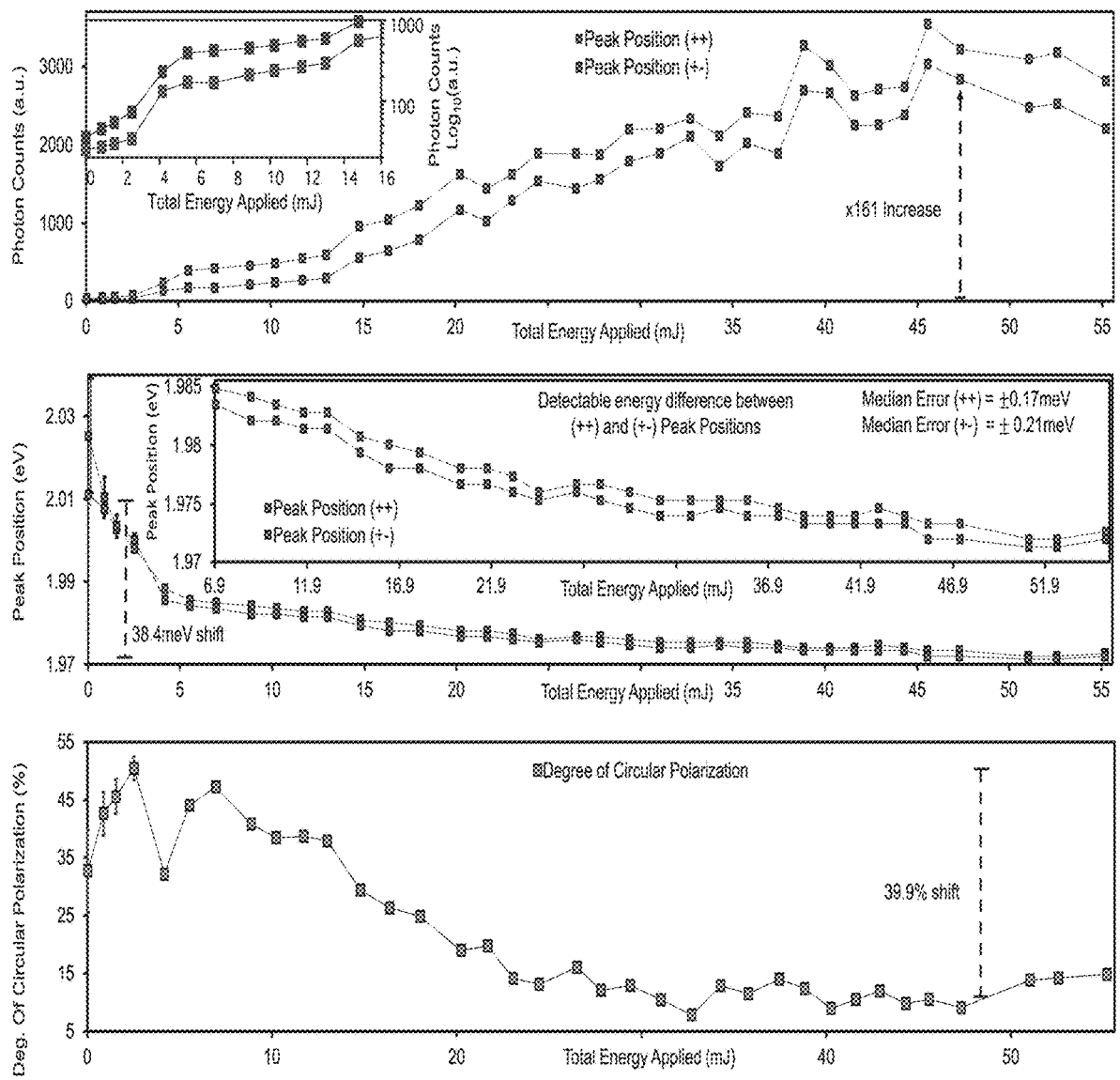
FIG. 6 illustrates Laser-Tunable and Spatially-Selectable Circular Polarization at Room Temperature. PL intensity, PL peak position, and degree of circular polarization (DoCP) when intermittently exposed to a low-power (13.5 µW) σ+ circular polarized 588 nm laser. The intensity increases a factor of ×161, and plateaus, before slightly decreasing. Inset: the photon counts plotted logarithmically better display the initial data points. The PL peak position decreases 38.4 meV. Inset: A clear energy difference between the (++) and (+−) states provides guidance into the intervalley scattering mechanism, suggesting energy is lost when the exciton scatters to the opposing valley. The circular polarization shifts 39.9%. The large circular polarization shift shows the large range the material can be tuned. All experiments were done at room temperature, making it attractive for applications.
Figure 7:
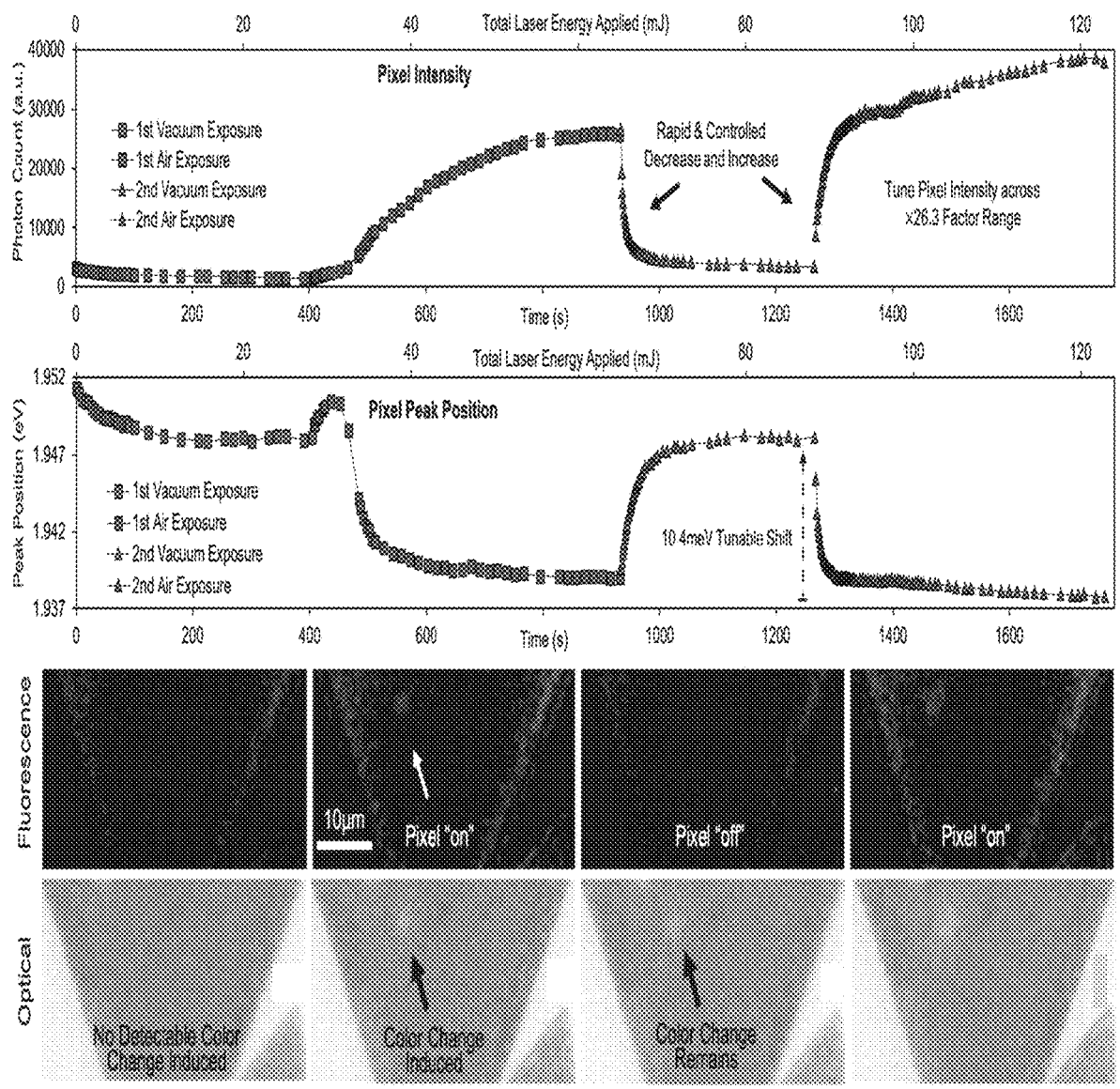
FIG. 7 illustrates Laser-Induced Changes are Reversable, demonstrating Write-read-erase-reuse Capability. PL intensity and PL peak position evolution as a function of air vs. vacuum (0.226 Torr) environment, while the 2D heterostructure is exposed to a low-power (70 µW) 532 nm laser. The PL intensity and PL peak position can be tuned over a large range with high precision. Fluorescence images and optical images corresponding to the data, showing changes to the fluorescence and optical color due to laser exposure. After $1^{st}$ vacuum exposure showing no detectable change. After $1^{st}$ air exposure, showing the pixel turning "on". After $2^{nd}$ vacuum exposure, showing the pixel turning "off". After the $2^{nd}$ air exposure, showing the pixel turning back "on". No color changed induced by the laser. Color change induced. Color change remains. Together these results show write-read-erase-reuse capability. The data was collected using a 50× ultralong objective due to setup constraints. A smaller laser spot and pixel size can be achieved using a 100× objective.
Figure 8:
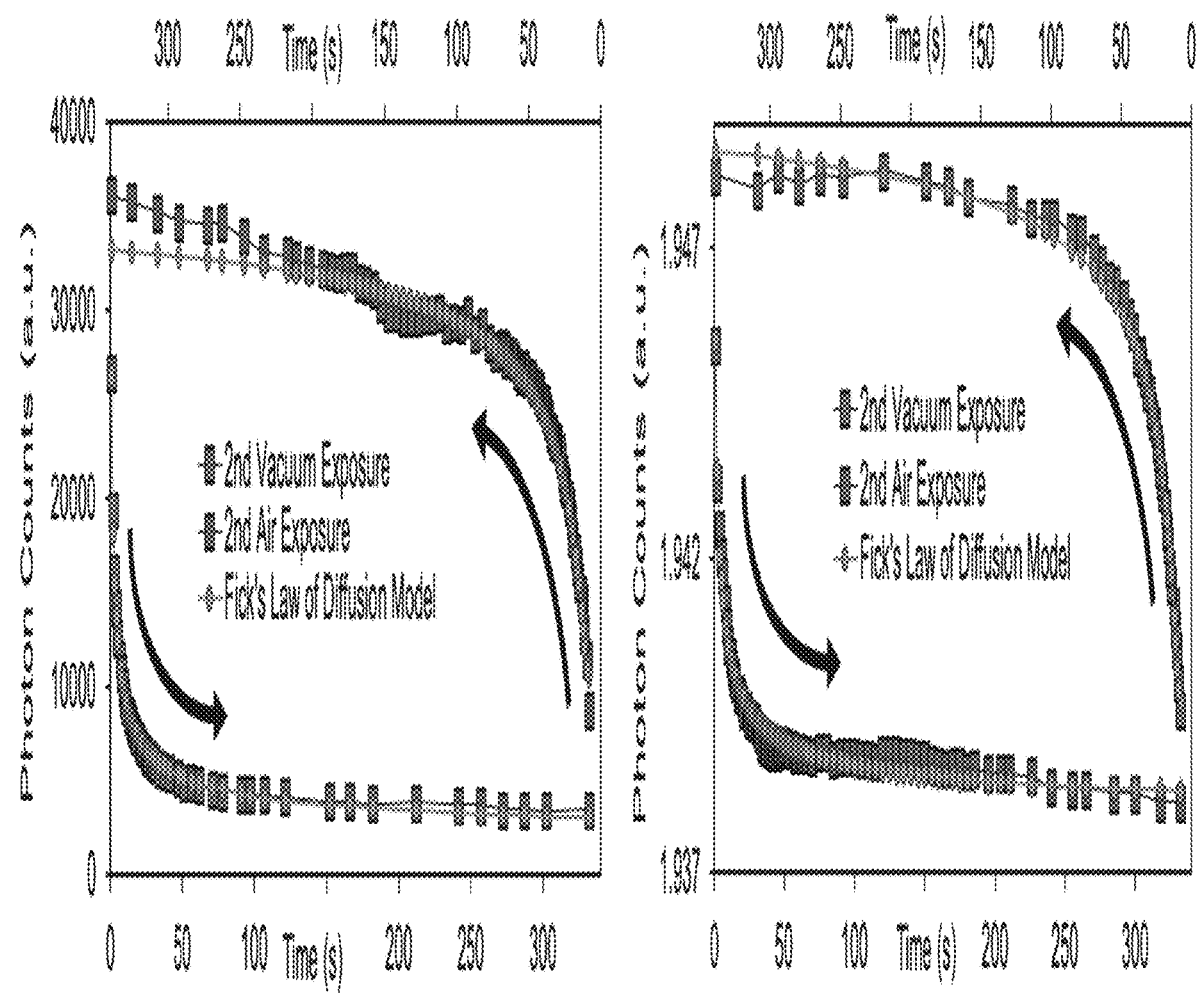
FIG. 8 illustrates Hysteresis behavior described by Fick's Law of Diffusion well. PL Intensity and PL peak position from $2^{nd}$ vacuum exposure and $2^{nd}$ air exposure shown in FIG. 5. The multistate and hysteresis behavior suggests the material is reusable and has applications for neurocomputing technology. The close fit with Fick's Law of Diffusion suggests that a gas is diffusing into and out of the material. As discussed later, oxygen is likely diffusing into and out of the material.
Figure 9:
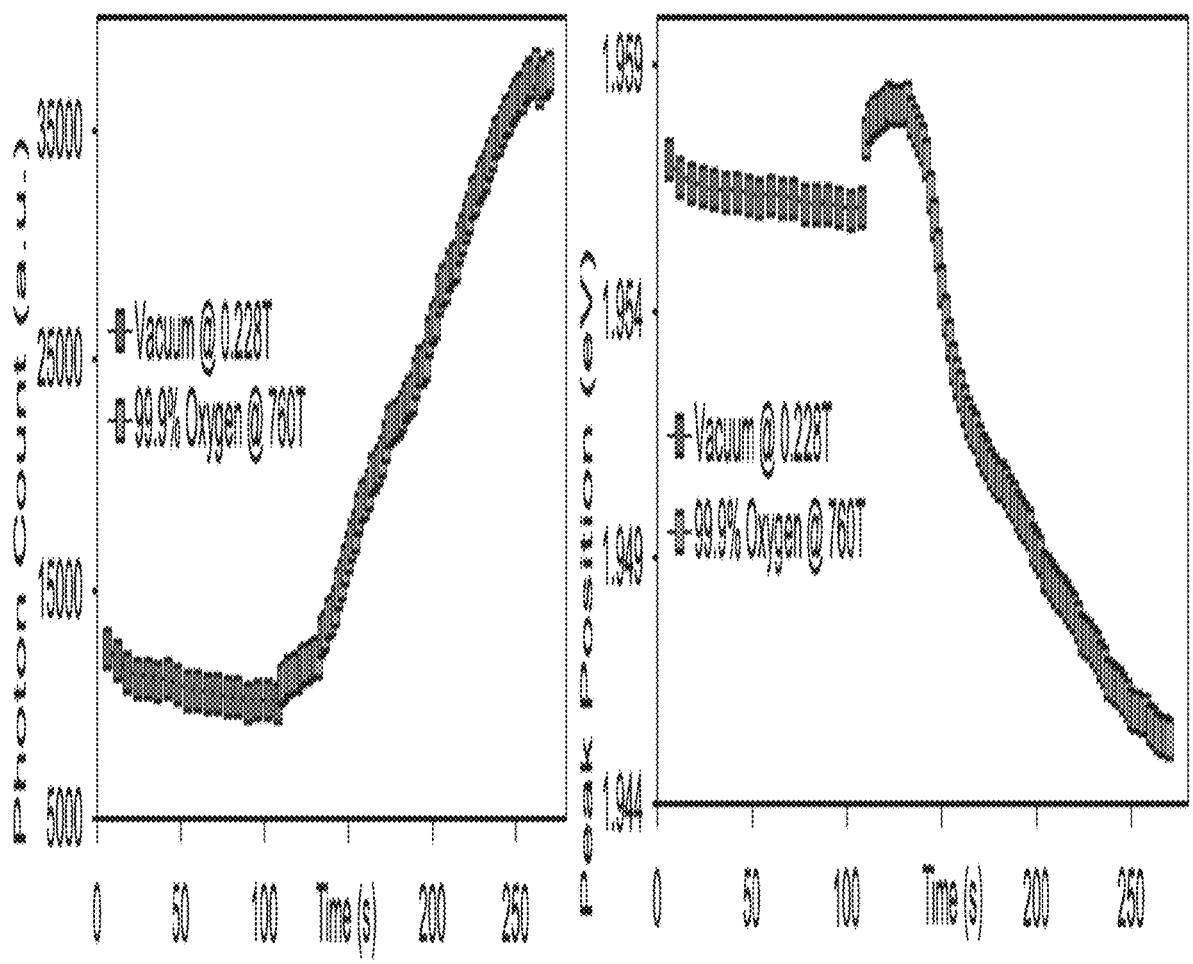
FIG. 9 illustrates Oxygen required to induce changes, demonstrating oxygen sensing applications. PL intensity and PL peak position as a function of vacuum (0.226T) vs. 99.9% oxygen (0.226T) environment, while the 2D heterostructure is exposed to a low-power (70 µW) 532 nm laser. When exposed to oxygen, changes are induced, suggesting oxygen is required for the primary mechanism. Changes are not induced when exposed to nitrogen while a laser is applied.
Figure 10:
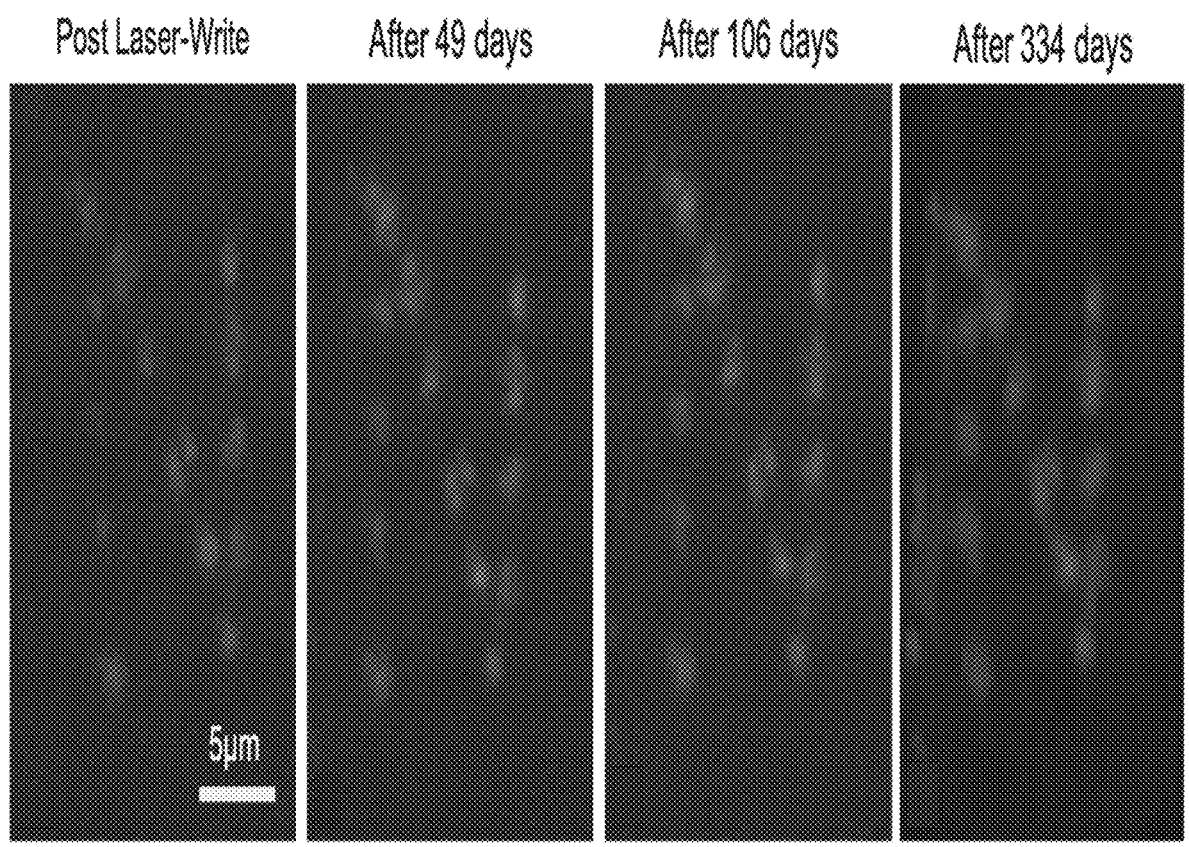
FIG. 10 illustrates changes are stable for long term with no detectable degradation. 2D Heterostructures were written with a laser, and kept in a nitrogen environment at room temperature. No detectable changes are observed, suggesting the laser-induced changes are robust.
Figure 11:
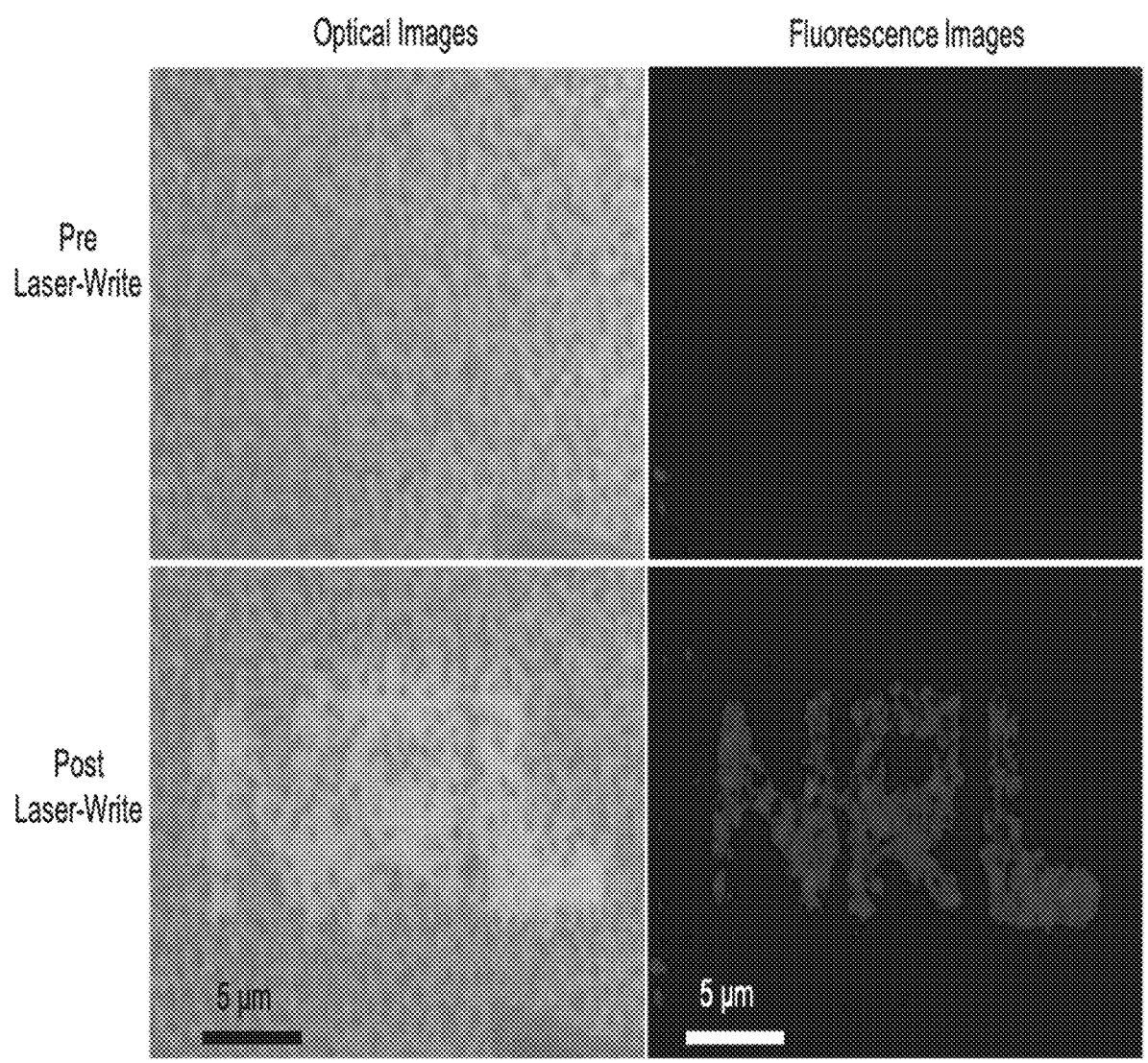
FIG. 11 illustrates a demonstration of writing continuous (non-discrete) patterns.
Figure 12:
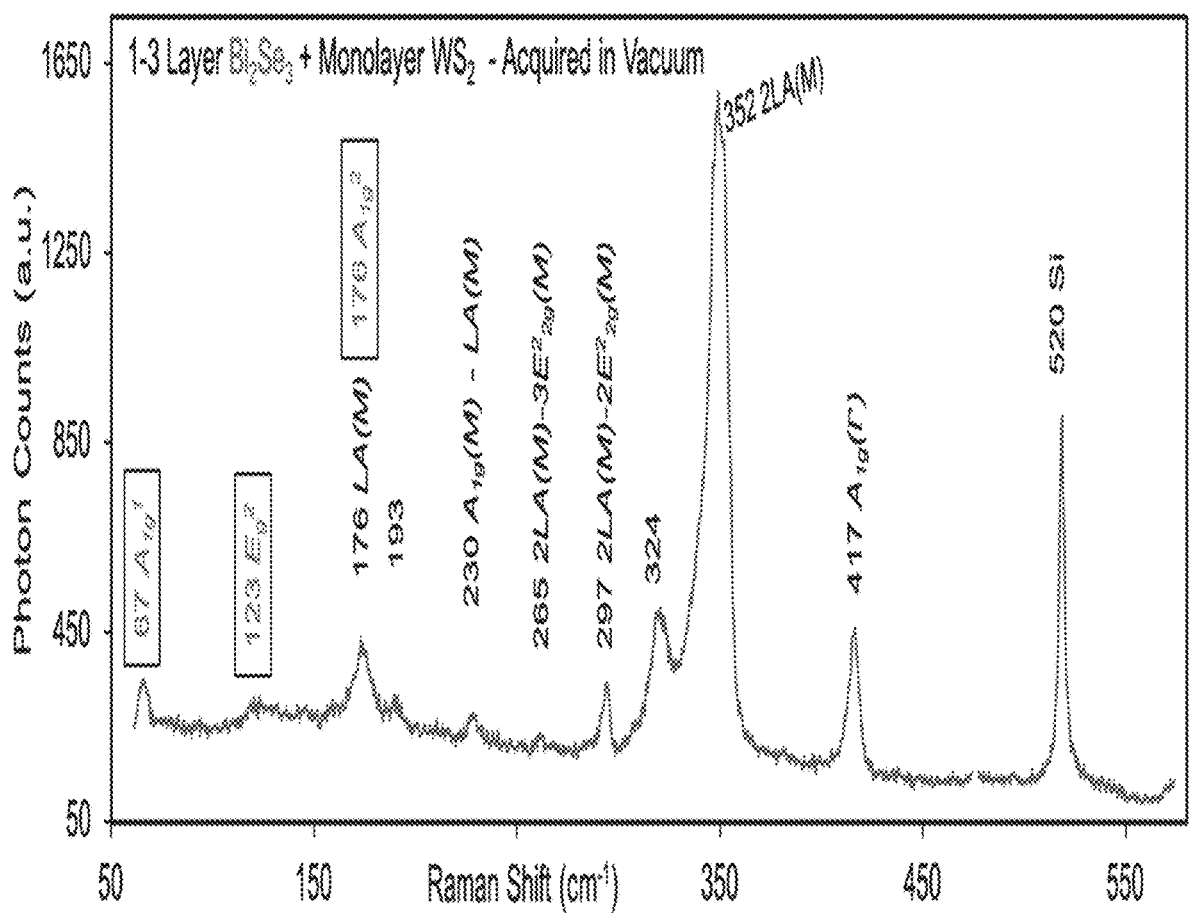
FIG. 12 illustrates representative Raman Spectra of an as-grown $Bi_2Se_3/WS_2$ 2D Heterostructure.
Figure 13:
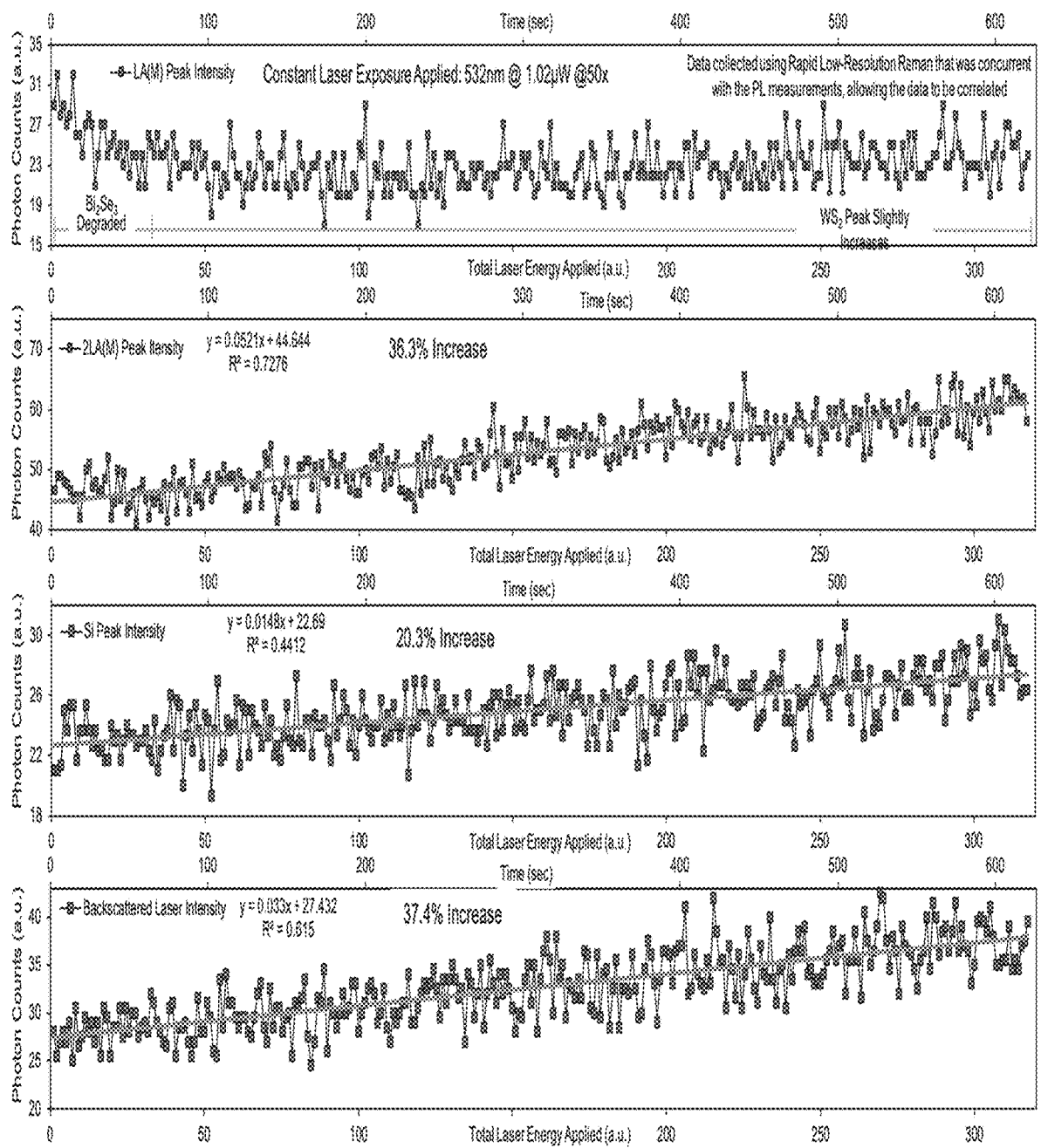
FIG. 13 illustrates Raman Signature evolves with initial laser-oxygen exposure. RLRR measurements correlated to laser-oxygen exposure measurements in FIG. 4.
Figure 14:
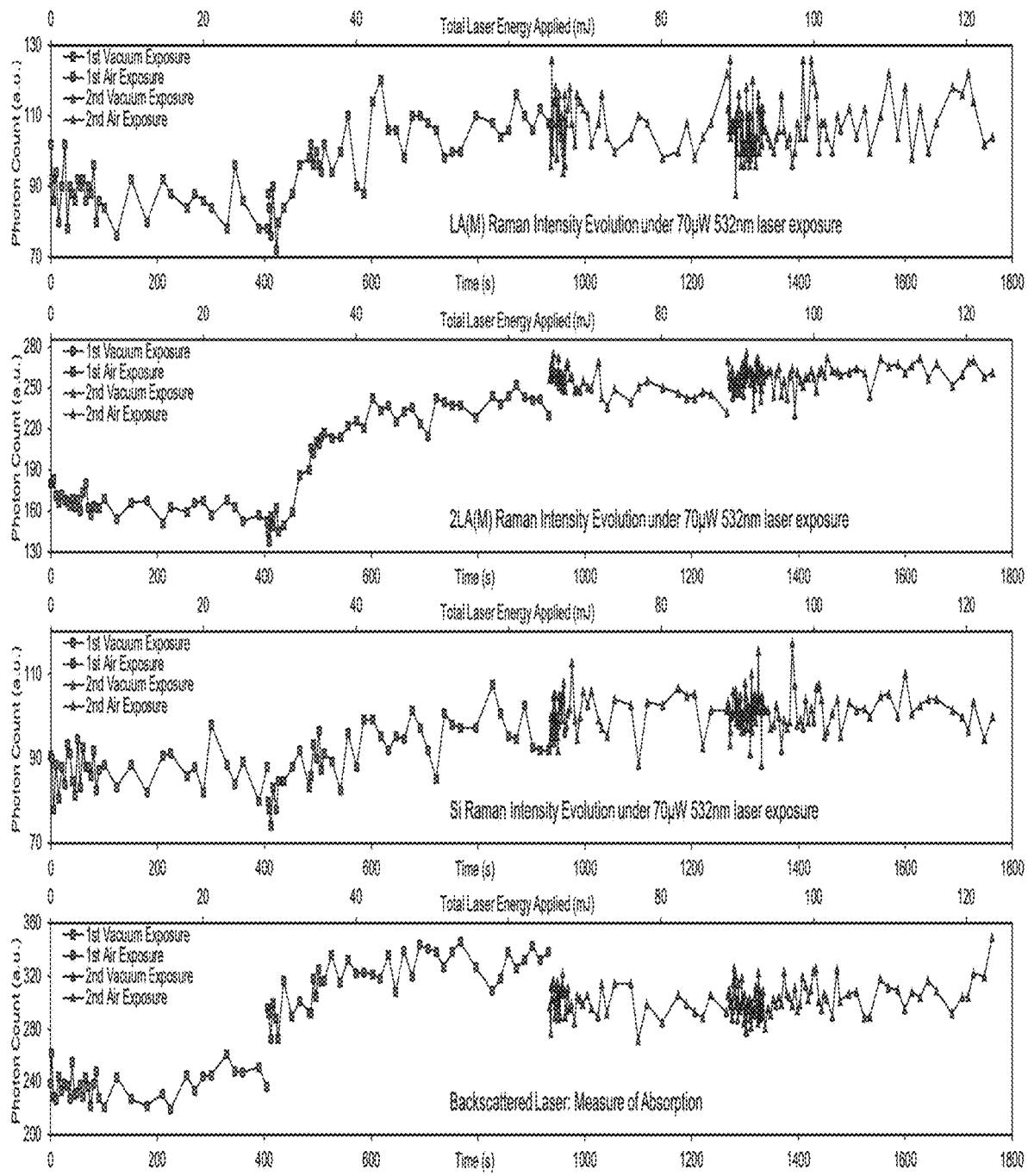
FIG. 14 illustrates No detectable effect of laser-vacuum exposure on the Raman modes. Although laser exposure in vacuum reverses the changes to the PL intensity and peak position, no changes to the Raman modes were detected. The above data is RLRR taken concurrent with the atmosphere cycling shown in FIG. 6.

FIG. 3 demonstrates how laser exposure in an oxygen-present environment (e.g., air) can be used to write or pattern the 2D heterostructure. FIG. 3 is an illustration showing the setup. FIG. 3 is an optical image after patterning the letter "N" into the 2D heterostructure using laser exposure in air. Laser exposure in an oxygen-present atmosphere induces a color change from purple to a lighter variant. FIG. 3 is a fluorescence image of the same 2D heterostructure from FIG. 3, demonstrating submicron (814 nm) feature resolution. Large differences in brightness are due primarily to different exposure times. FIG. 3 representative PL spectra from an as-grown 2D heterostructure and after various exposure times in air, showing the large increase in PL intensity and peak position shifts. The PL peak position evolution is nonlinear, initially shifting to higher energies, before reversing direction and shifting to lower energies.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What we claim is:

1. A method of laser-writing submicron pixels with tunable circular polarization and write-read-erase-reuse capability on a nano-material or two-dimensional heterostructure at room temperature, comprising the steps of:
    applying a laser to a nano-material or two-dimensional heterostructure;
    writing a submicron pixel;
        wherein the submicron pixel has a circular polarization;
    modifying the circular polarization;
    allowing the circular polarization to be tuned across a range of 39.9%;
    tuning photoluminescence intensity across a factor of 161 times; and
    tuning photoluminescence peak position across a range of 38 meV.

2. The method of laser-writing submicron pixels with tunable circular polarization and write-read-erase-reuse capability on a nano-material or two-dimensional heterostructure at room temperature of claim 1
    wherein the nano-material or two-dimensional heterostructure comprises $Bi_2Se_2$.

3. The method of laser-writing submicron pixels with tunable circular polarization and write-read-erase-reuse capability on a nano-material or two-dimensional heterostructure at room temperature of claim 2, comprising the additional steps of:
    applying the laser in an atmosphere absent of oxygen;
    tuning the circular polarization;
    tuning the photoluminescence intensity;
    tuning the photoluminescence peak position; and
    enabling the material to be controllably erased and changes reversed.

4. The method of laser-writing submicron pixels with tunable circular polarization and write-read-erase-reuse capability on a nano-material or two-dimensional heterostructure at room temperature of claim 3
    wherein the nano-material or two-dimensional heterostructure comprises $Bi_2Se_3$/$WS_2$ and
    wherein the nano-material or two-dimensional heterostructure is reusable.

5. The method of laser-writing submicron pixels with tunable circular polarization and write-read-erase-reuse capability on a nano-material or two-dimensional heterostructure at room temperature of claim 4
    wherein the steps occur at room temperature.

6. The method of laser-writing submicron pixels with tunable circular polarization and write-read-erase-reuse capability on a nano-material or two-dimensional heterostructure at room temperature of claim 5
    wherein the laser is a low-power laser.

7. The method of laser-writing submicron pixels with tunable circular polarization and write-read-erase-reuse capability on a nano-material or two-dimensional heterostructure at room temperature of claim 6
    wherein the laser comprises 0.60 micro Watts;
    wherein the laser written submicron pixels are written at 814 nm resolution;
    wherein the tuning is stable for greater than 106 days; and
    wherein the thickness of the $SiO_2$ is 275 nm.

8. The method of laser-writing submicron pixels with tunable circular polarization and write-read-erase-reuse capability on a nano-material or two-dimensional heterostructure at room temperature of claim 7
    wherein increasing the laser power increases speed at which the changes are induced.

9. The method of laser-writing submicron pixels with tunable circular polarization and write-read-erase-reuse capability on a nano-material or two-dimensional heterostructure at room temperature of claim 2, further comprising the step of:
    providing an oxygen environment;
    wherein the pixels are written with submicron resolution using a laser in the oxygen environment.

10. The method of laser-writing submicron pixels with tunable circular polarization and write-read-erase-reuse capability on a nano-material or two-dimensional heterostructure at room temperature of claim 9,
   wherein the pixels are written at 814 nm resolution;
   wherein the tuning is stable for greater than 334 days; and
   wherein the thickness of the $SiO_2$ is 275 nm.

11. A method of growing a nano-material or two-dimensional heterostructure for laser-writing submicron pixels with tunable circular polarization and write-read-erase-reuse capability on the nano-material or two-dimensional heterostructure at room temperature, comprising the steps of:
   providing $SiO_2$/Si substrates;
   cleaning the $SiO_2$/Si substrates in acetone, IPA, and Piranha etch;
   rinsing the $SiO_2$/Si substrates in deionized water;
   positioning at the center of a furnace a first quartz boat containing about 1 g of $WO_3$ powder;
   positioning a first $SiO_2$/Si substrate face-down, directly above the $WO_3$ powder;
   positioning a second quartz boat containing sulfur powder upstream, outside the furnace-heating zone, for the synthesis of $WS_2$;
   positioning a second $SiO_2$/Si substrate above the second quartz boat;
      wherein the second $SiO_2$/Si substrate contains perylene-3,4,9,10-tetracarboxylic acid tetrapotassium salt (PTAS) seeding molecules;
wherein the first $SiO_2$/Si substrate is untreated;
   allowing the PTAS seeding molecules to be carried downstream to the first substrate which is untreated;
   promoting lateral growth of a monolayer $WS_2$;
   utilizing pure argon at 65 sccm as the furnace heats to a target temperature;
   heating the furnace to a temperature of 825° C.;
   adding 10 sccm $H_2$ to the Ar flow and maintaining;
   cooling to room temperature; and
   resulting in a monolayer $WS_2$.

12. The method of growing a nano-material or two-dimensional heterostructure for laser-writing submicron pixels with tunable circular polarization and write-read-erase-reuse capability on the nano-material or two-dimensional heterostructure at room temperature of claim 11, further comprising the steps of:
   growing a layer of $Bi_2Se_3$ on top of the monolayer of $WS_2$ using chemical vapor deposition (CVD) in a two-zone furnace with a 2" quartz tube;
   wherein the step of growing a layer of $Bi_2Se_3$ on top of the monolayer of $WS_2$ using chemical vapor deposition (CVD) in a two-zone furnace with a 2" quartz tube comprises the steps of
   grinding High-purity $Bi_2Se_3$ flakes into a fine dust;
   placing in a ceramic boat the fine dust of $Bi_2Se_3$;
   inserting the ceramic boat into the quartz tube;
   pushing the ceramic boat into the center of the first zone of the furnace;
   placing the monolayer $WS_2$, which is on an $SiO_2$ substrate, downstream of the $Bi_2Se_3$ into the center of the second zone of the furnace;
   pumping down the furnace to ~20 mTorr;
   flowing an argon (Ar) carrier gas into the furnace at 80 sccm;
   heating the $Bi_2Se_3$ to a temperature of 520° C.;
   heating the $WS_2$ to a temperature of 210° C.;
   heating at a ramp rate of ~55° C./min; and
   growing $Bi_2Se_3$/$WS_2$ for 27 min.

13. The method of growing a nano-material or two-dimensional heterostructure for laser-writing submicron pixels with tunable circular polarization and write-read-erase-reuse capability on a nano-material or two-dimensional heterostructure at room temperature of claim 12
   wherein 1-3 layers of $Bi_2Se_3$ is grown on the monolayer $WS_2$ using CVD; and
   wherein the $WS_2$ grows crystalline.

14. The method of growing a nano-material or two-dimensional heterostructure for laser-writing submicron pixels with tunable circular polarization and write-read-erase-reuse capability on a nano-material or two-dimensional heterostructure at room temperature of claim 13
   wherein the $Bi_2Se_3$/$WS_2$ 2D heterostructure comprises complete coverage of $Bi_2Se_3$ on the $WS_2$.

15. The method of growing a nano-material or two-dimensional heterostructure for laser-writing submicron pixels with tunable circular polarization and write-read-erase-reuse capability on a nano-material or two-dimensional heterostructure at room temperature of claim 14
   wherein monolayer $Bi_2Se_3$ flakes several microns in size were grown on the monolayer $WS_2$;
   wherein both the $Bi_2Se_3$ and the $WS_2$ have long-range crystallinity;
   wherein the $Bi_2Se_3$ flakes or crystals grow at a 0° twist angle as the most stable configuration; and
   wherein the interlayer interaction modulates the growth.

16. A method of laser-writing submicron pixels with tunable circular polarization and write-read-erase-reuse capability on a nano-material or two-dimensional heterostructure at room temperature, comprising the steps of:
   applying a laser to a nano-material or two-dimensional heterostructure;
   writing a submicron pixel;
      wherein the submicron pixel has a circular polarization;
   modifying the circular polarization;
   allowing the circular polarization to be tuned across a range of 39.9%;
   tuning photoluminescence intensity across a factor of 161 times; and
   tuning photoluminescence peak position across a range of 38 meV,
wherein the nano-material or two-dimensional heterostructure comprises $Bi_2Se_3$/$WS_2$.

17. A nano-material or two-dimensional heterostructure for laser-writing submicron pixels with tunable circular polarization and write-read-erase-reuse capability on the nano-material or two-dimensional heterostructure at room temperature, formed by the steps of:
   providing $SiO_2$/Si substrates;
   cleaning the $SiO_2$/Si substrates in acetone, IPA, and Piranha etch;
   rinsing the $SiO_2$/Si substrates in deionized water;
   positioning at the center of a furnace a first quartz boat containing about 1 g of $WO_3$ powder;
   positioning a first $SiO_2$/Si substrate face-down, directly above the $WO_3$ powder;
   positioning a second quartz boat containing sulfur powder upstream, outside the furnace-heating zone, for the synthesis of $WS_2$;
   positioning a second $SiO_2$/Si substrate above the second quartz boat;
      wherein the second $SiO_2$/Si substrate contains perylene-3,4,9,10-tetracarboxylic acid tetrapotassium salt (PTAS) seeding molecules;
wherein the first $SiO_2$/Si substrate is untreated;

allowing the PTAS seeding molecules to be carried downstream to the first substrate which is untreated;
promoting lateral growth of a monolayer $WS_2$;
utilizing pure argon at 65 sccm as the furnace heats to a target temperature;
heating the furnace to a temperature of 825° C.;
adding 10 sccm $H_2$ to the Ar flow and maintaining;
cooling to room temperature; and
resulting in a monolayer $WS_2$.

18. The nano-material or two-dimensional heterostructure for laser-writing submicron pixels with tunable circular polarization and write-read-erase-reuse capability on the nano-material or two-dimensional heterostructure at room temperature of claim 17, further comprising the steps of:
growing a layer of $Bi_2Se_3$ on top of the monolayer of $WS_2$ using chemical vapor deposition (CVD) in a two-zone furnace with a 2" quartz tube;
wherein the step of growing a layer of $Bi_2Se_3$ on top of the monolayer of $WS_2$ using chemical vapor deposition (CVD) in a two-zone furnace with a 2" quartz tube comprises the steps of
grinding High-purity $Bi_2Se_3$ flakes into a fine dust;
placing in a ceramic boat the fine dust of $Bi_2Se_3$;
inserting the ceramic boat into the quartz tube;
pushing the ceramic boat into the center of the first zone of the furnace;
placing the monolayer $WS_2$, which is on an $SiO_2$ substrate, downstream of the $Bi_2Se_3$ into the center of the second zone of the furnace;
pumping down the furnace to ~20 mTorr;
flowing an argon (Ar) carrier gas into the furnace at 80 sccm;
heating the $Bi_2Se_3$ to a temperature of 520° C.;
heating the $WS_2$ to a temperature of 210° C.;
heating at a ramp rate of ~55° C./min; and
growing $Bi_2Se_3/WS_2$ for 27 min.

19. A laser-writing submicron pixel with tunable circular polarization and write-read-erase-reuse capability on a nano-material or two-dimensional heterostructure at room temperature, formed by the steps of:
applying a laser to a nano-material or two-dimensional heterostructure;
wherein the nano-material or two-dimensional heterostructure comprises $Bi_2Se_3/WS_2$;
wherein the submicron pixel has a circular polarization;
modifying the circular polarization;
allowing the circular polarization to be tuned across a range of 39.9%;
wherein photoluminescence intensity can be tuned across a factor of 161 times; and
wherein photoluminescence peak position can be tuned across a range of 38 meV.

* * * * *